United States Patent
Tsai et al.

(10) Patent No.: US 7,732,344 B1
(45) Date of Patent: Jun. 8, 2010

(54) HIGH SELECTIVITY ETCHING PROCESS FOR METAL GATE N/P PATTERNING

(75) Inventors: Fang Wen Tsai, Hsinchu (TW); Matt Yeh, Hsinchun (TW); Ming-Jun Wang, Taichung County (TW); Shun Wu Lin, Taichung (TW); Chi-Chun Chen, Kaohsiung (TW); Zin-Chang Wei, Hsin-Chu (TW); Chyi-Shyuan Chern, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/478,922

(22) Filed: Jun. 5, 2009

(51) Int. Cl.
*H01L 21/302* (2006.01)

(52) U.S. Cl. .................. 438/734; 438/705; 438/706; 438/745; 438/942; 257/E21.023; 257/E21.218; 257/E21.219

(58) Field of Classification Search .................. 438/183, 438/185, 599, 707, 749; 257/E21.016, E21.017, 257/E21.02, E21.023, E21.045, E21.051, 257/E21.061, E21.246

See application file for complete search history.

(56) References Cited

U.S. PATENT DOCUMENTS

| 6,995,095 | B2 * | 2/2006 | Yu | 438/750 |
| 7,611,943 | B2 * | 11/2009 | Liu | 438/232 |
| 2009/0075441 | A1 * | 3/2009 | Chou et al. | 438/197 |

* cited by examiner

*Primary Examiner*—Charles D Garber
*Assistant Examiner*—Cheung Lee
(74) *Attorney, Agent, or Firm*—Haynes and Boone, LLP

(57) ABSTRACT

A method for fabricating a integrated circuit with improved performance is disclosed. The method comprises providing a substrate; forming a hard mask layer over the substrate; forming protected portions and unprotected portions of the hard mask layer; performing a first etching process, a second etching process, and a third etching process on the unprotected portions of the hard mask layer, wherein the first etching process partially removes the unprotected portions of the hard mask layer, the second etching process treats the unprotected portions of the hard mask layer, and the third etching process removes the remaining unprotected portions of the hard mask layer; and performing a fourth etching process to remove the protected portions of the hard mask layer.

20 Claims, 14 Drawing Sheets

HIGH SELECTIVITY ETCHING PROCESS FOR METAL GATE N/P PATTERNING

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also lead to high-k dielectric layers and conductive (e.g., metal) layers being adopted to form gate stacks in various IC devices, such as metal-oxide-semiconductor field-effect-transistors (MOSFETs). The conductive layers are often tuned to have a proper work function to achieve a designed threshold voltage for n-type and p-type devices. Currently, the conductive layers are patterned using an etching process, for example, a dry etching process or a wet etching process. However, it has been observed that a dry etching process results in damage to the high-k dielectric and conductive layers, and sometimes, leaves photoresist residue; and a wet etching process often results in lateral etching, degrading patterning profiles.

Accordingly, what is needed is a method for making an IC device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
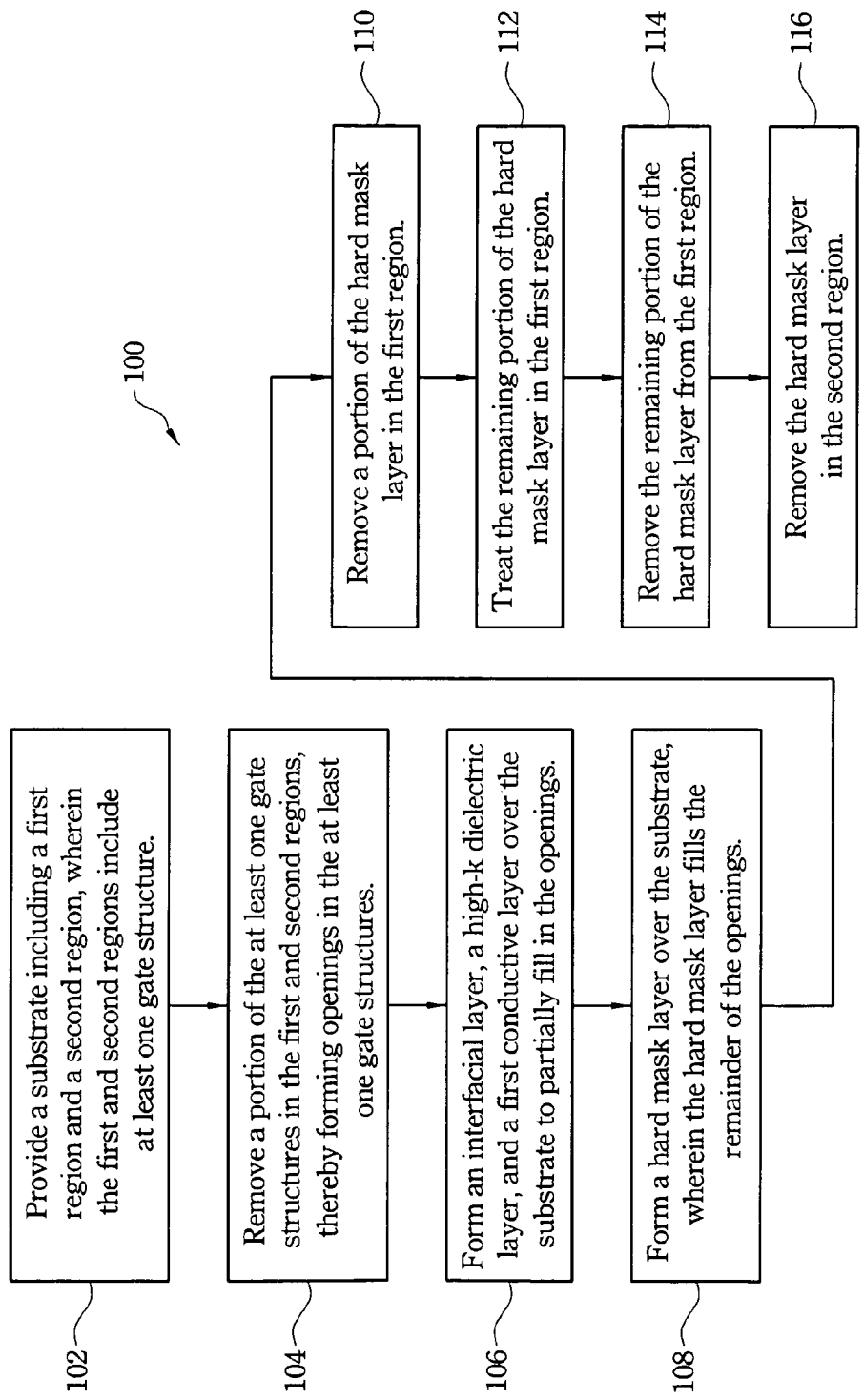
FIG. 1 is a flow chart of a method for fabricating an integrated circuit device according to aspects of the present invention.

The present disclosure relates generally to methods for manufacturing integrated circuit devices, and more particularly, to a method for manufacturing a semiconductor device that improves etching selectivity.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
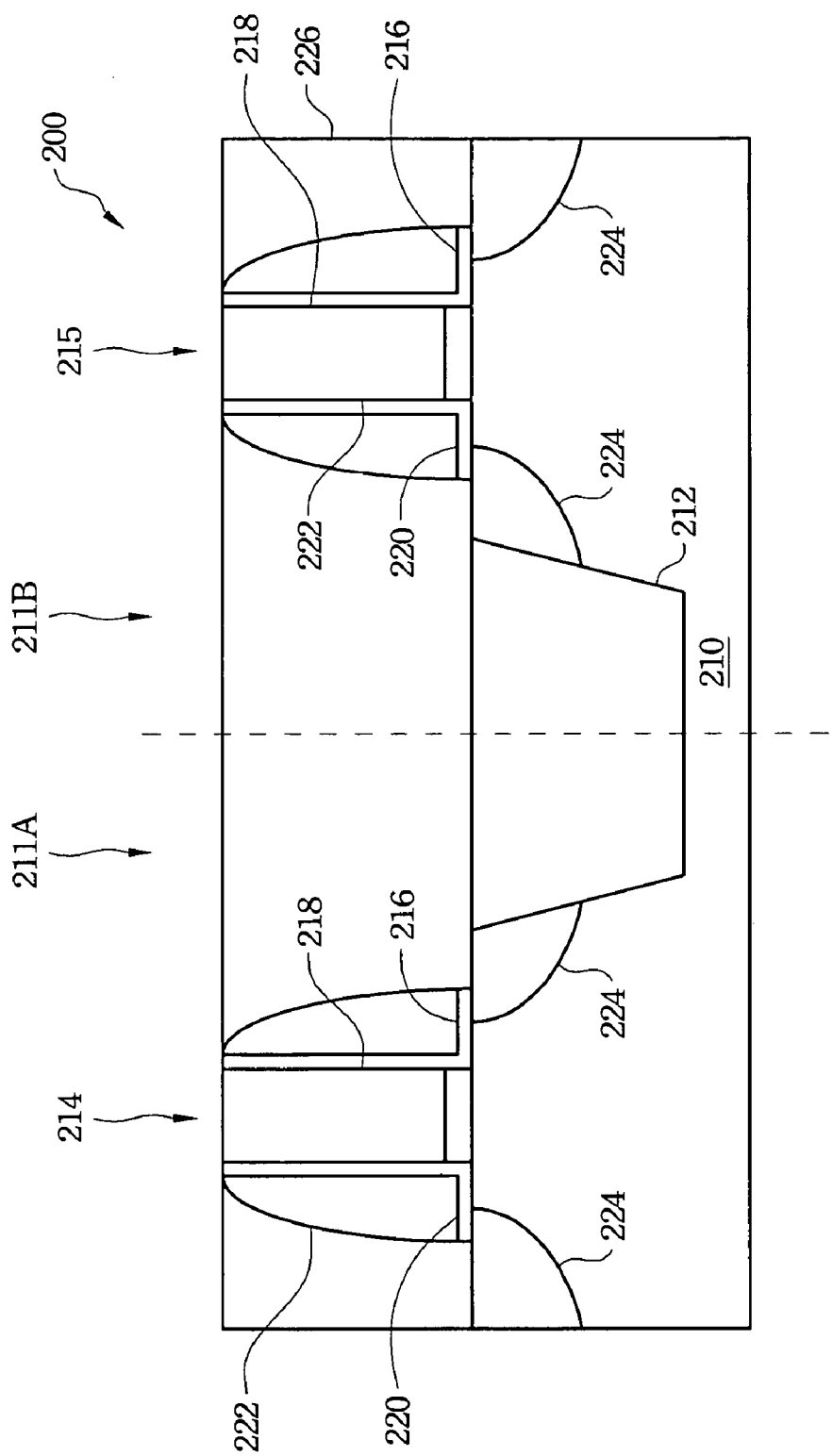
FIGS. 2A-2M are various cross-sectional views of embodiments of an integrated circuit device during various fabrication stages according to the method of FIG. 1.
Figure 2B:
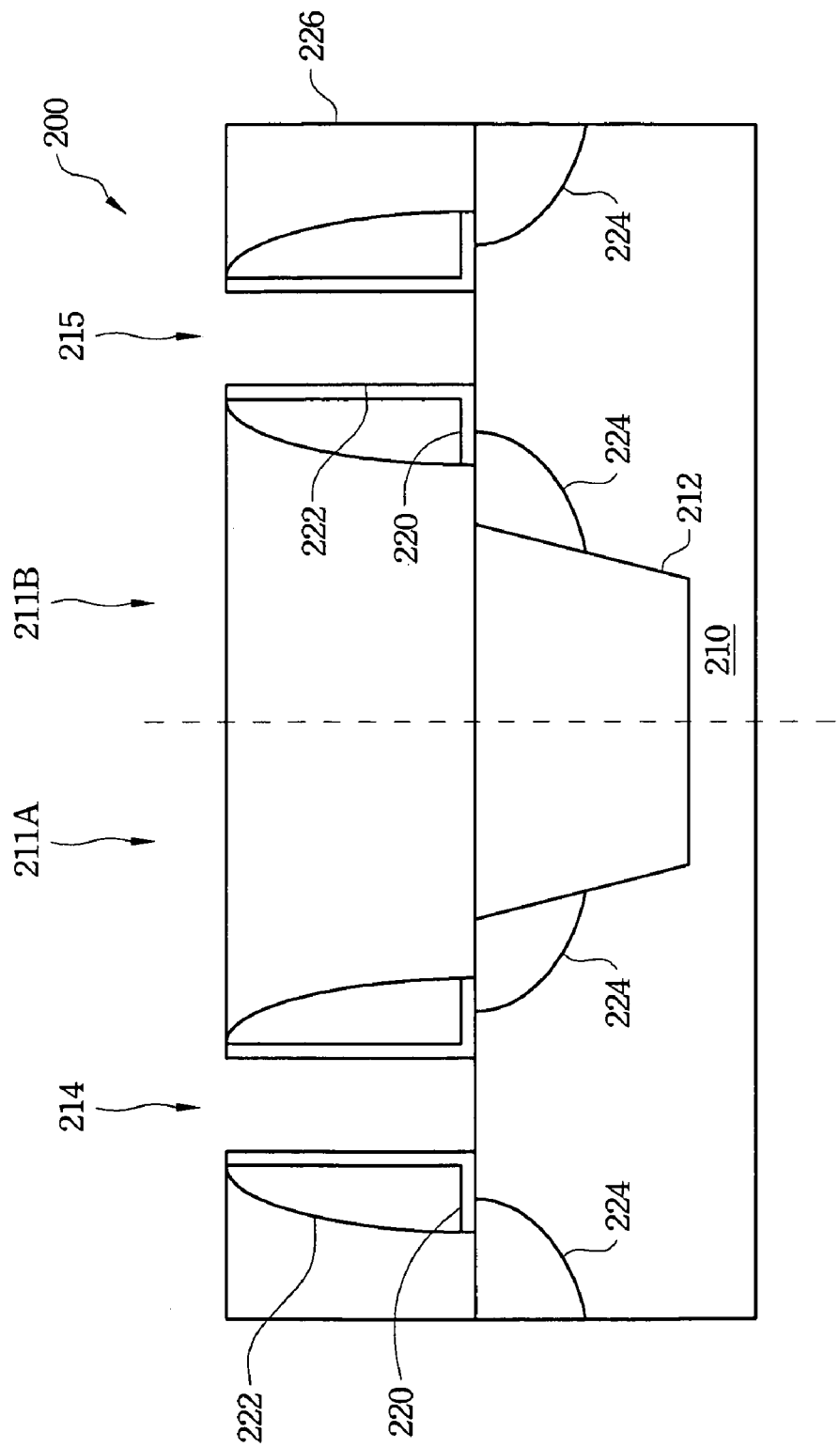
Figure 2C:
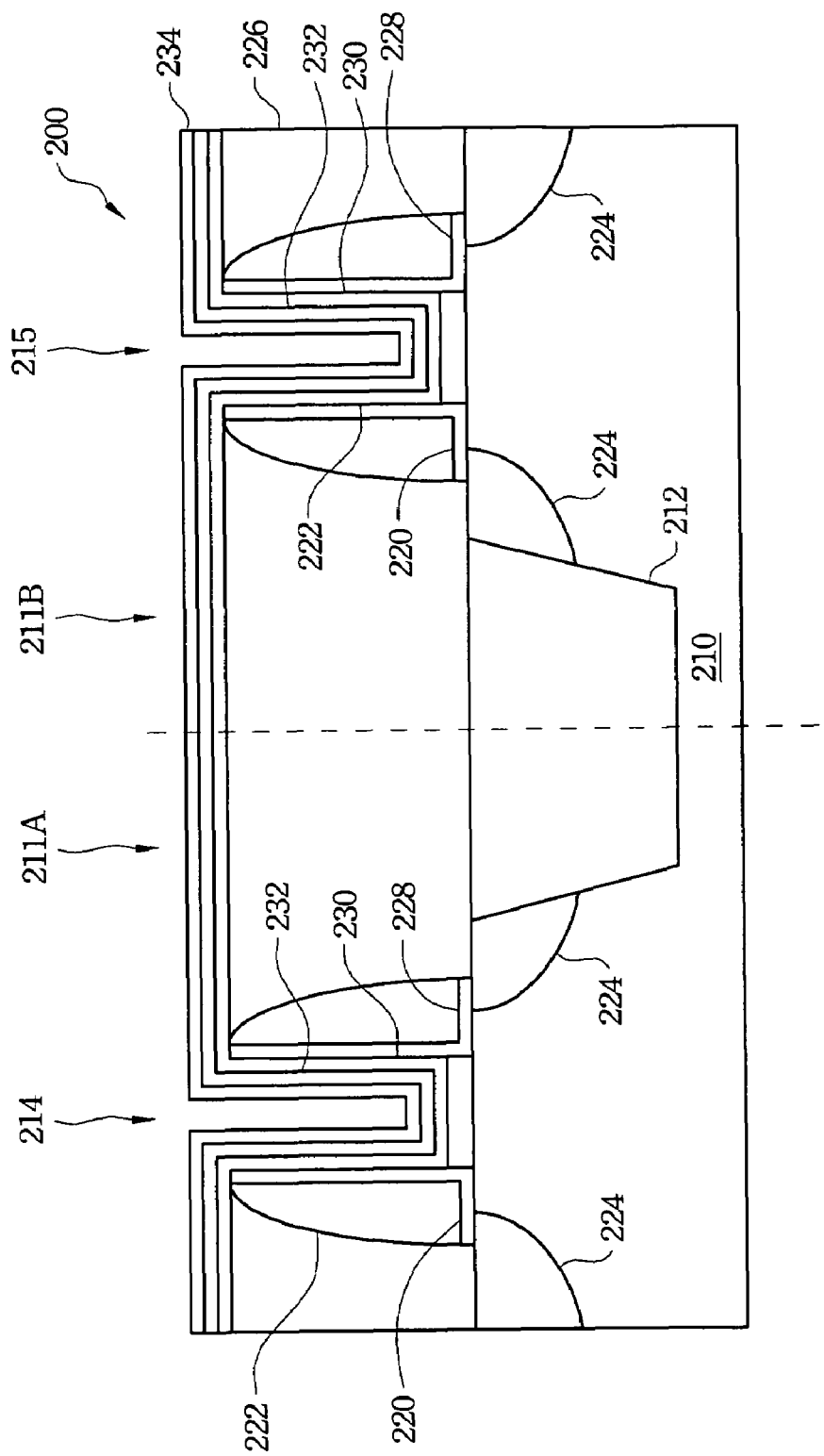
Figure 2D:
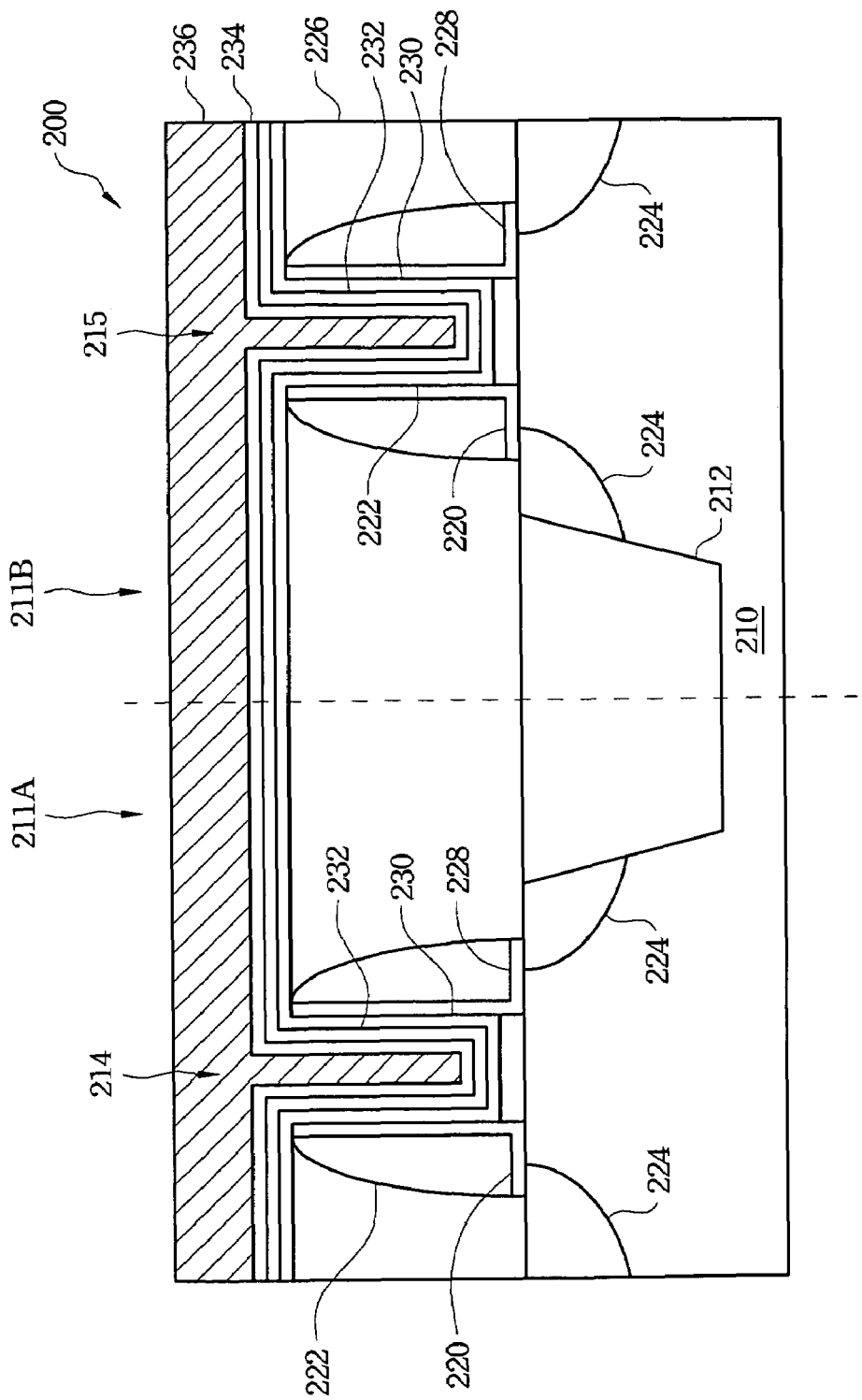
Figure 2E:
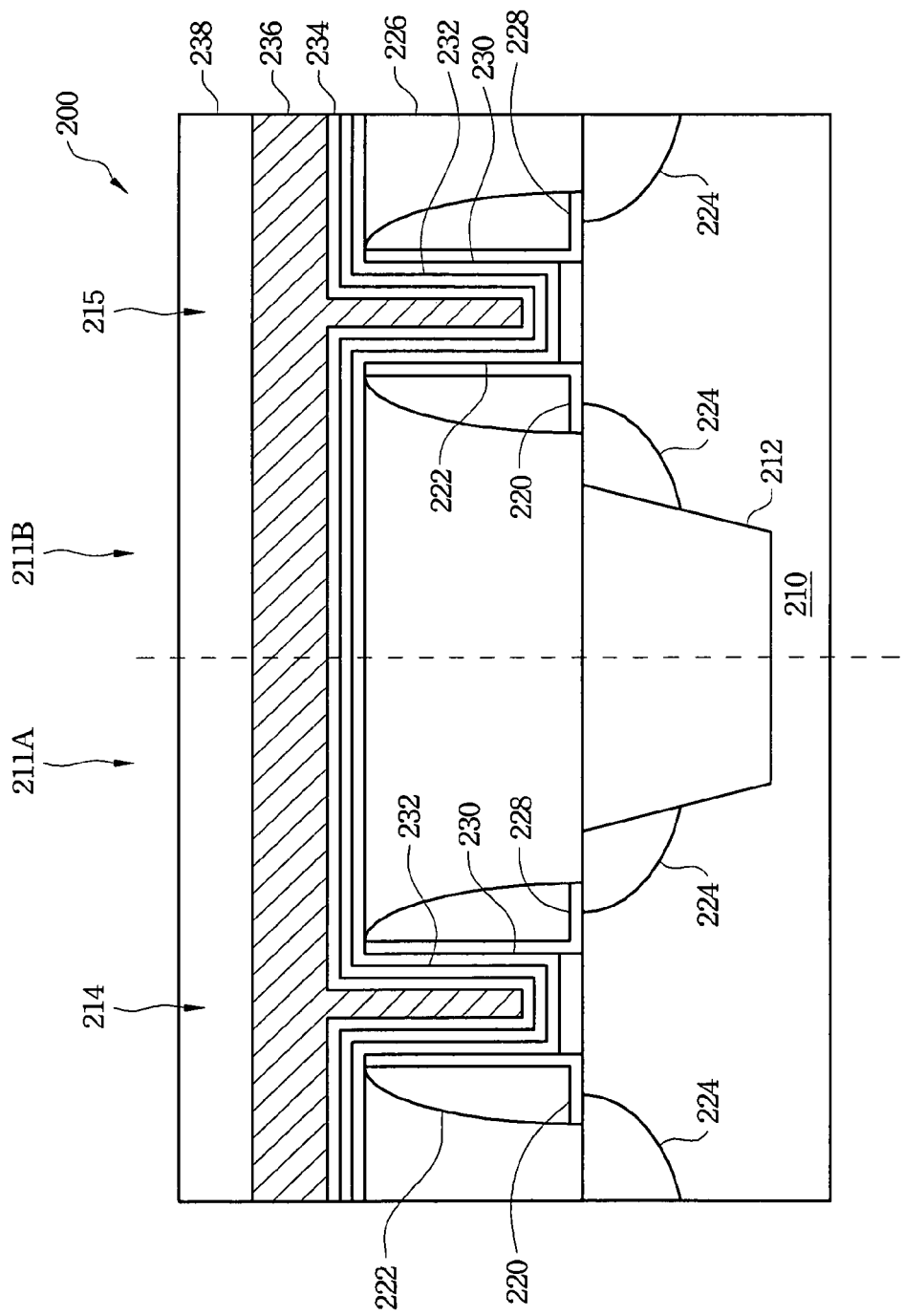
Figure 2F:
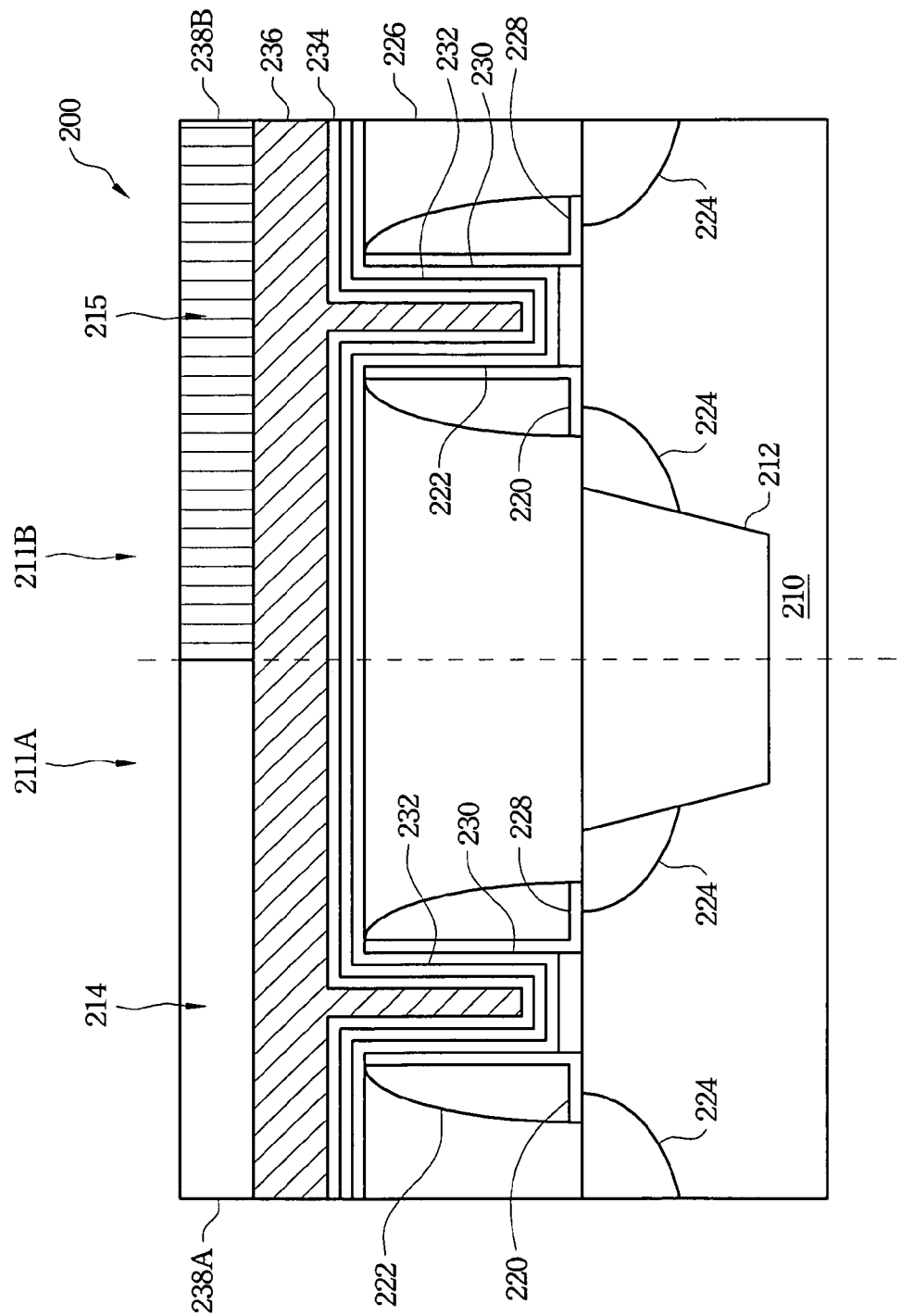
Figure 2G:
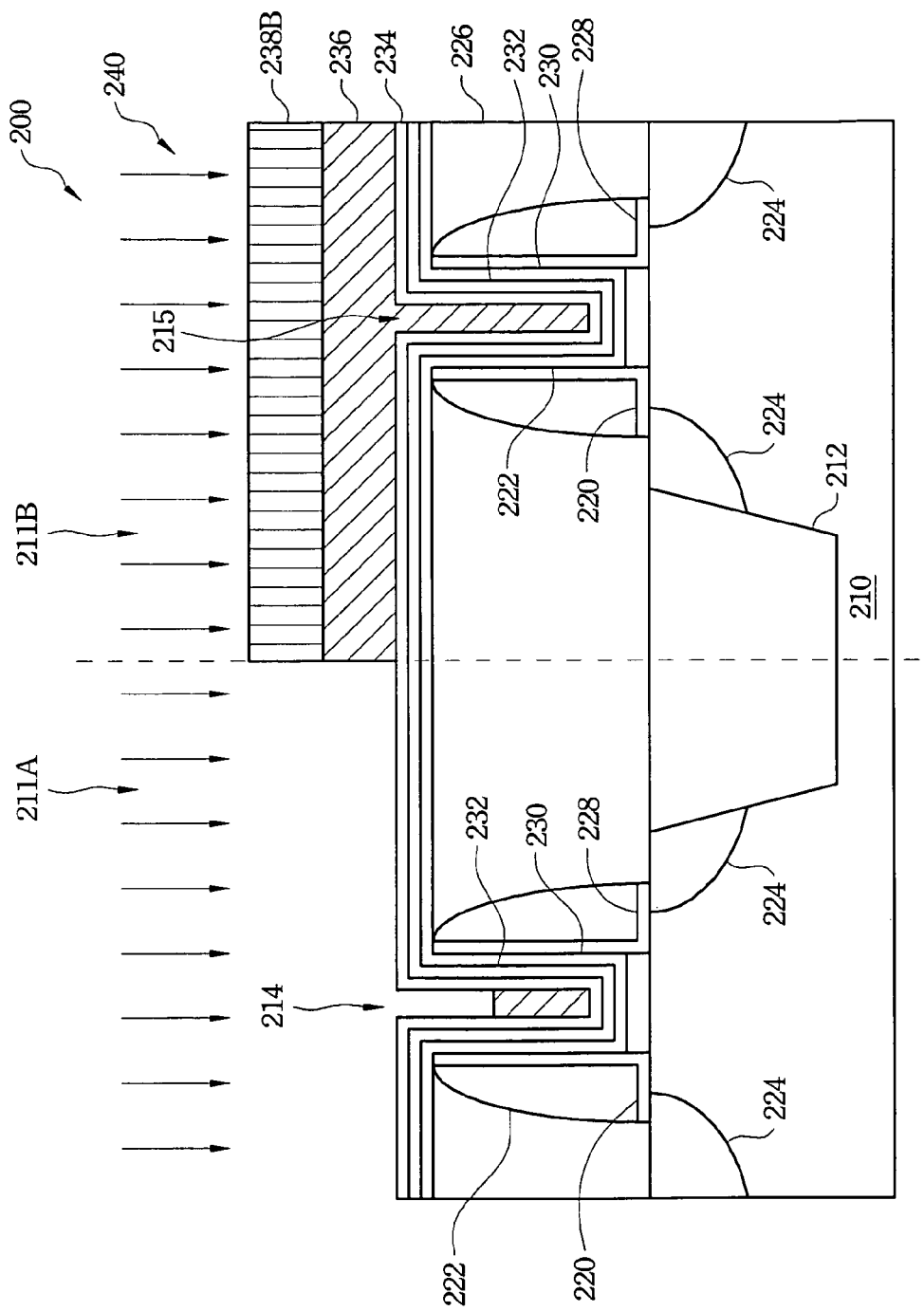
Figure 2H:
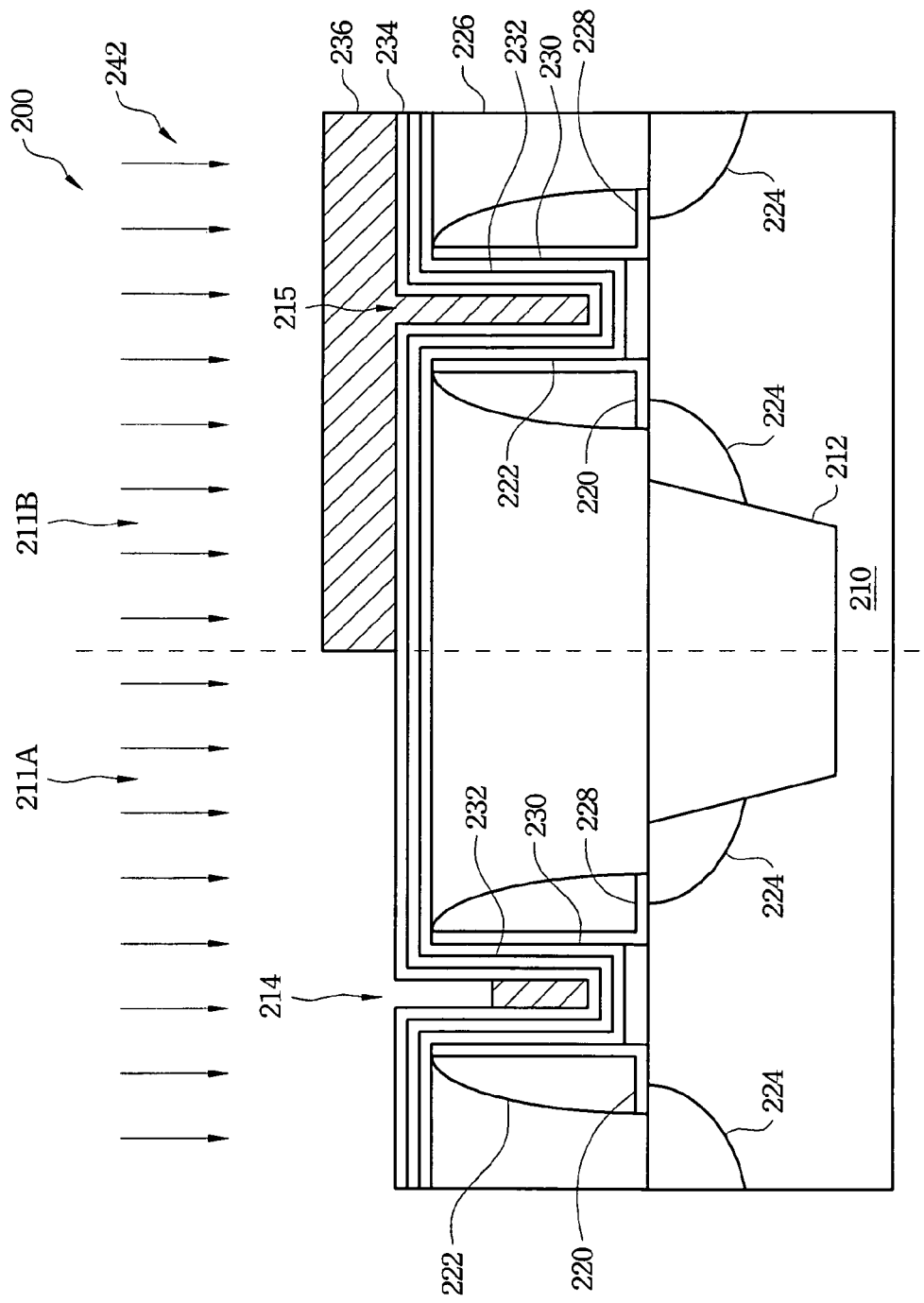
Figure 2I:
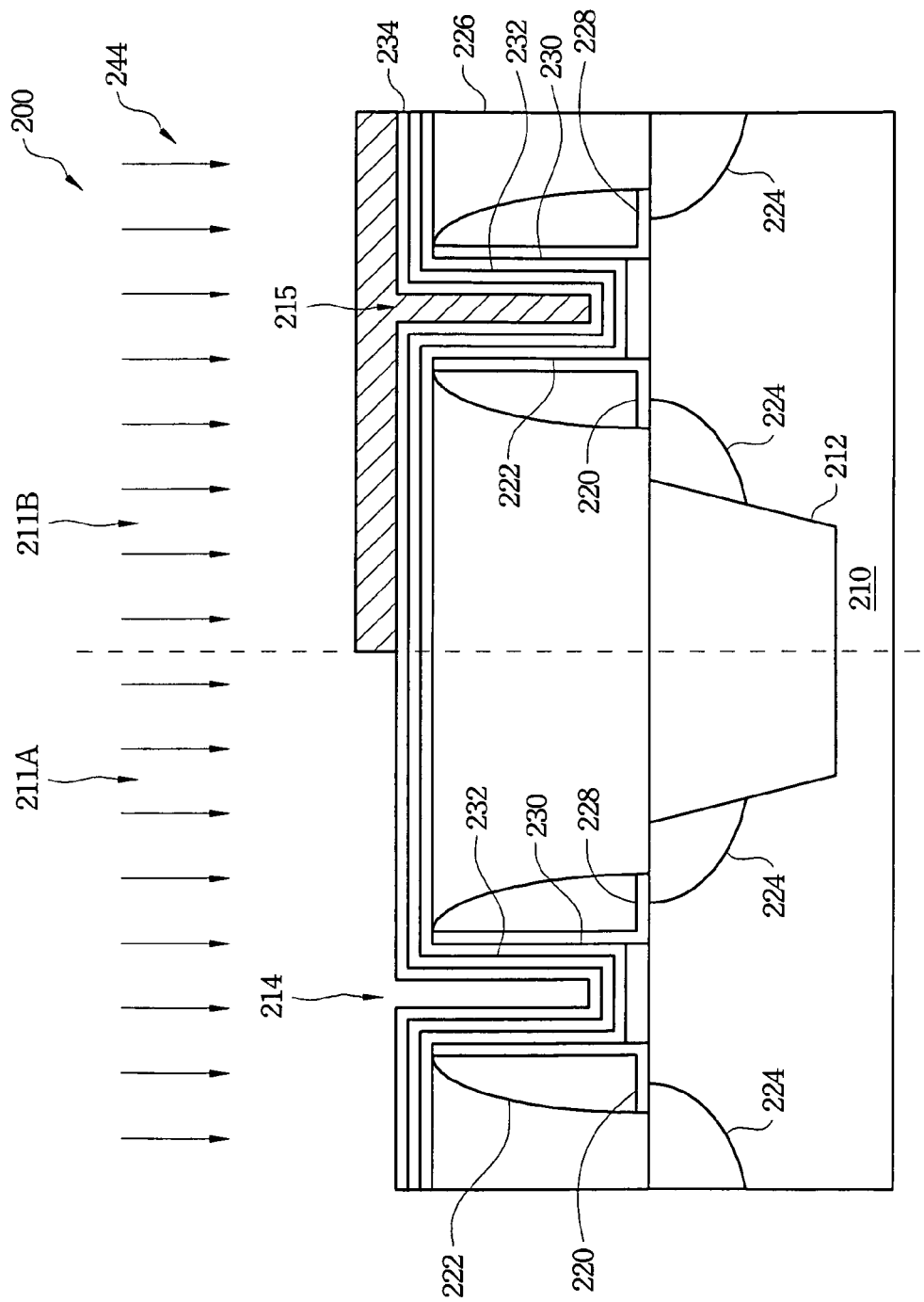
Figure 2J:
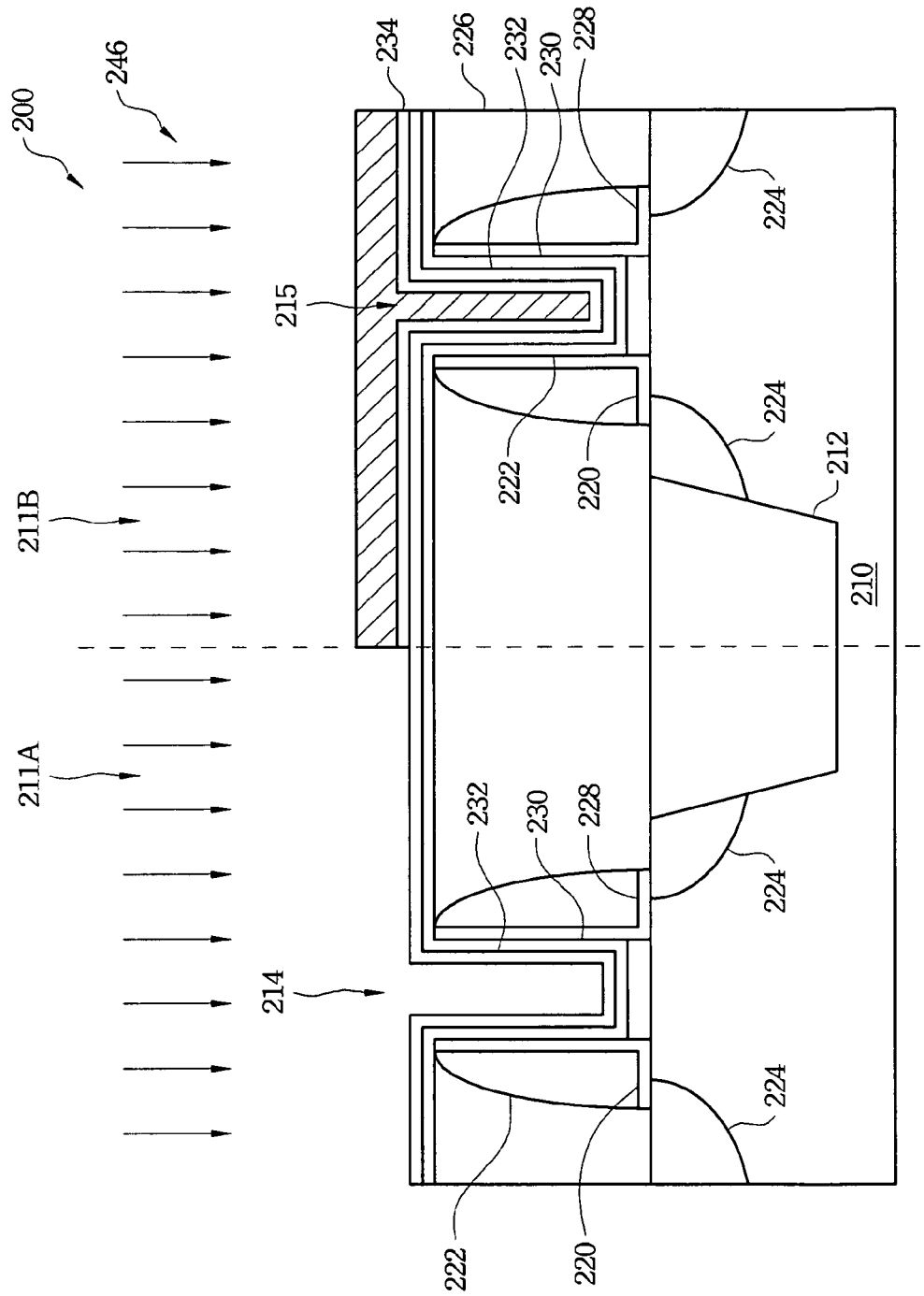
Figure 2K:
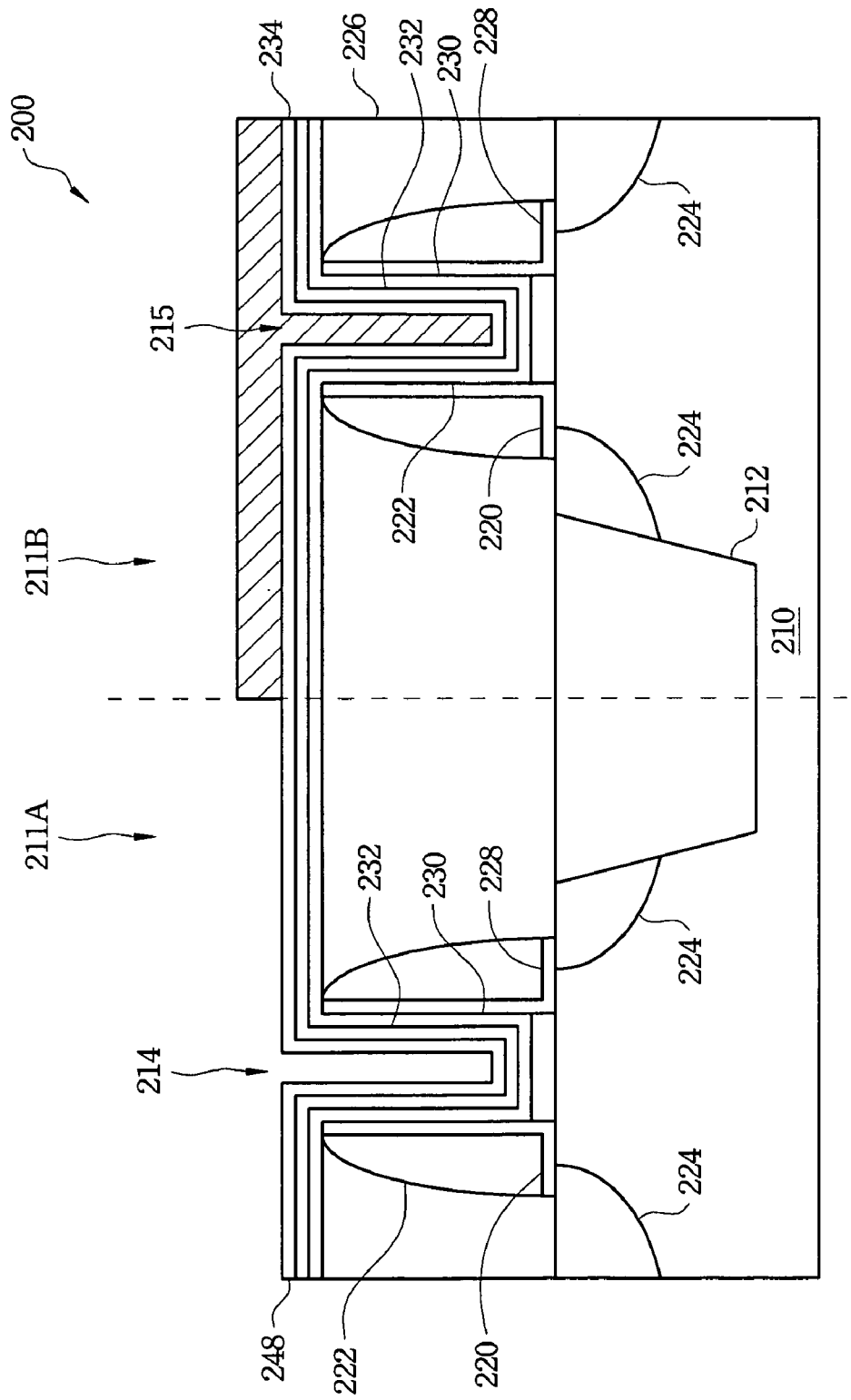
Figure 2L:
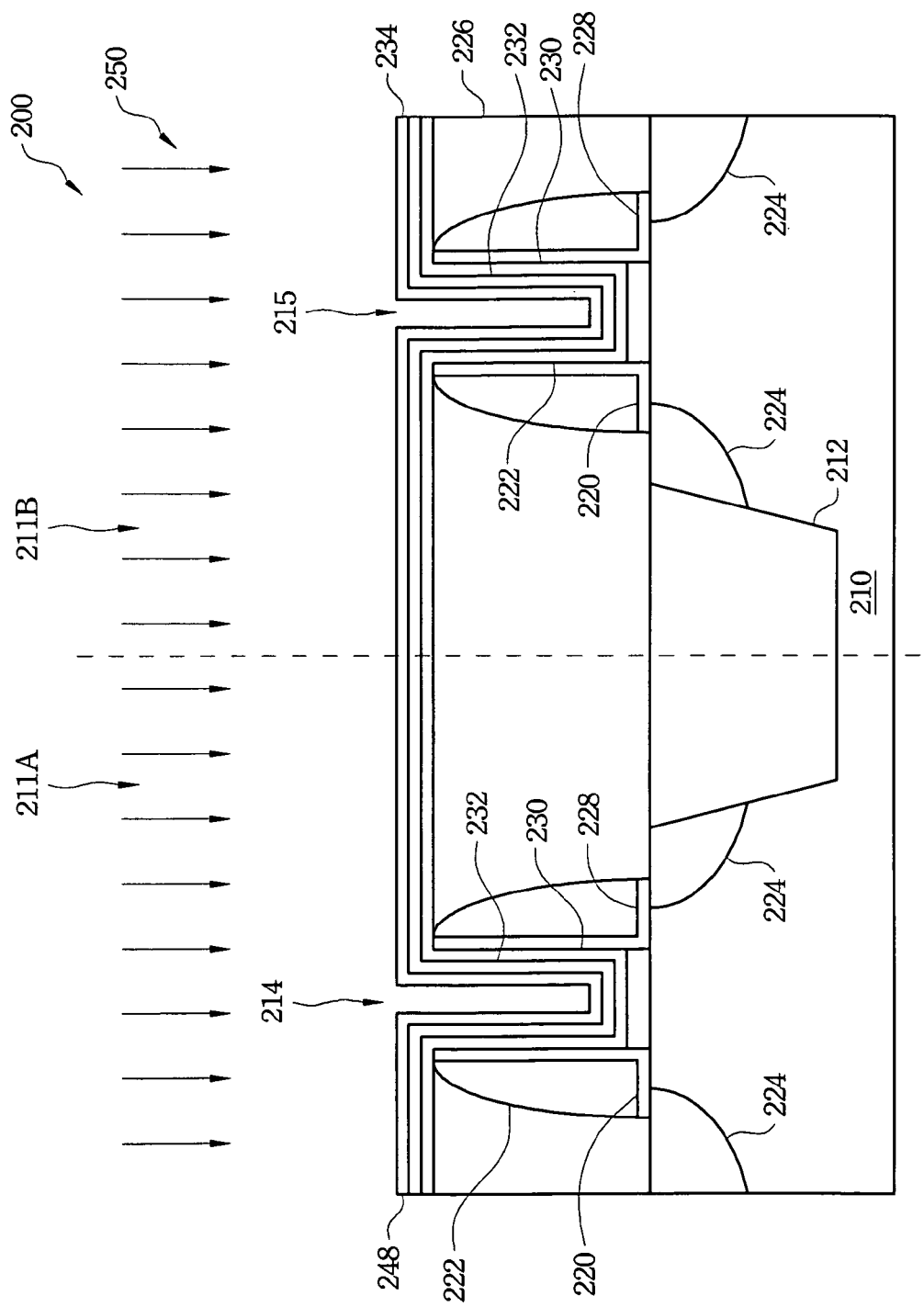
Figure 2M:
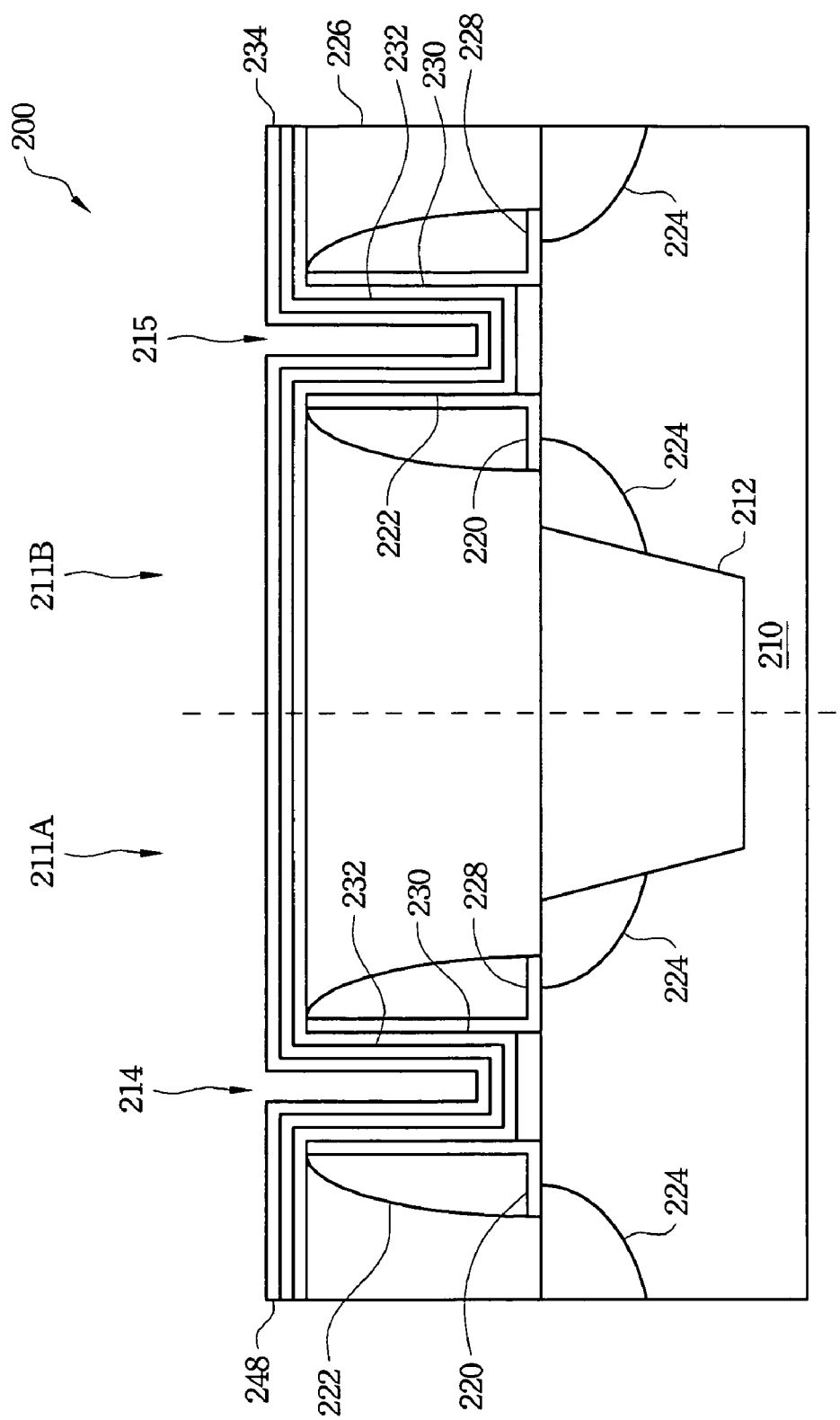

With reference to FIGS. 1 through 2M, a method 100 and a semiconductor device 200 are collectively described below. FIG. 1 is a flow chart of one embodiment of the method 100 for making the semiconductor device 200. FIGS. 2A-2M are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIGS. 1 and 2A, the method 100 begins at step 102 wherein a substrate 210 including a first region 211A and a second region 211B is provided. In the present embodiment, the substrate 210 is a semiconductor substrate. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. Still, in other examples, the substrate 210 may comprise a non-semiconductor material.

Substrate 210 may include various doping configurations depending on design requirements as known in the art (e.g., p-type substrate regions or n-type substrate regions). In some embodiments, the substrate 210 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the substrate 210, in a P-well structure, in a N-well structure, in a dual-well structure, or using a raised structure. For example, in the present embodiment, the substrate 210 includes first region 211A configured for an NMOS device and second region 211B configured for a PMOS device. It is understood that the semiconductor device 200 may be formed by CMOS technology processing, and thus some processes are not described in detail herein.

At least one isolation region 212 is formed on the substrate 210 to isolate various regions (e.g., first and second regions 211A, 211B) of the substrate 210, and in the present embodiment, to isolate the NMOS and PMOS device regions. The isolation region 212 may utilize isolation technology, such as LOCOS or STI, to define and electrically isolate the various first and second regions 211A, 211B. In the present embodiment, the isolation region 212 includes a STI. The isolation region 212 may comprise silicon oxide, silicon nitride, silicon oxynitride, fluoride-doped silicate glass, a low-K dielectric material, other suitable materials, and/or combinations thereof. The isolation region 212, and in the present embodiment, the STI, may be formed by any suitable process.

The substrate 210 further includes one or more gate structures 214, 215. Referring to FIG. 2A, the one or more gate structures may be formed over the substrate 210. In the present embodiment, a first gate structure 214 is formed within the first/NMOS region 211A, and a second gate structure 215 is formed within the second/PMOS region 211B. The gate structures 214, 215 include gate stacks having interfacial dielectric layers 216 and dummy gate layers 218; gate spacer liners 220; and gate spacers 222. It is understood that a plurality of gate structures may be formed over the substrate 210 in the first and second regions 211A, 211B.

The gate structures 214, 215 may be formed by any suitable process. For example, the gate structures may be formed by conventional deposition, photolithography patterning, and etching processes, and/or combinations thereof. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structures may be formed simultaneously, utilizing the same processing steps and processing materials; independently of one another, utilizing varying processing steps and processing materials; or using a combination of simultaneous and independent processing steps and processing materials.

The interfacial dielectric layers 216 are formed over the substrate 210, and the dummy gate layers 218 are formed over the interfacial dielectric layers 216. The interfacial dielectric layers 216 may be formed by any suitable process and to any suitable thickness. For example, the interfacial dielectric layers 216 may include a grown $SiO_2$ layer. The interfacial dielectric layers 216 may further comprise SiON. In some embodiments, before the interfacial dielectric layers 216 are grown over the substrate 210, a last pre-gate clean (e.g., utilizing an HF solution) and UV process may be performed. In some embodiments, the interfacial dielectric layers 216 may be formed by rapid thermal oxidation. Further, in some embodiments, the interfacial dielectric layers 216 may be omitted entirely.

The dummy gate layers 218 may comprise a multilayer structure comprising multiple dielectric materials. The dummy gate layers 218 may comprise a layer including a high-k dielectric material, which may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, and/or combinations thereof. The dummy gate layers 218 may comprise a layer including a dielectric material, such as silicon-containing materials including polycrystalline silicon, silicon oxide, silicon nitride, silicon oxynitride, and silicon carbide; germanium-containing materials; hafnium oxide, zirconium oxide, titanium oxide, aluminum oxide, hafnium dioxide-alumina ($HfO_2$—$Al_2O_3$) alloy, other suitable dielectric materials, and/or combinations thereof. In some embodiments, the dummy gate layers 218 comprise a layer of silicon dioxide and a layer of high-k dielectric material. Further, the dummy gate layers 218 may be doped polycrystalline silicon with the same or different doping. In the present embodiment, the dummy gate layers 218 comprise polysilicon. It is understood that additional layers may be included in the gate structures 214, 215, such as capping layers, barrier layers, and/or buffer layers.

The gate structures 214, 215 further include gate spacer liners 220 and gate spacers 222. The gate spacer liners 220 and gate spacers 222 may comprise any suitable material and be formed by any suitable process. For example, the gate spacer liners 220 may comprise a spacer oxide, and/or the gate spacers 222, which are positioned on each side of the gate stacks of gate structures 214, 215, may comprise a dielectric material such as silicon nitride, silicon oxide, silicon carbide, silicon oxynitride, other suitable materials, or combinations thereof. Further, the spacers 222 may be formed by depositing the dielectric material by CVD, ALD, PVD, and/or other suitable processes and then etching. In some embodiments, the gate spacer liners 220 may be omitted entirely. In some embodiments, the gate spacer liner 220 and/or gate spacers 222 may comprise multiple layers.

The semiconductor device 200 further comprises doped regions 224. Doped regions 224 may be formed in the substrate 210 located proximate to each end of the gate structures 214, 215, respectively, and may comprise various doping profiles. The doped regions 224 may be doped heavily or lightly and n-type or p-type. In alternate embodiments, the doped regions may be formed directly on the semiconductor substrate, in a P-well structure, in a N-well structure, in a dual-well structure, or using a raised structure. The doped regions 224 are formed by any suitable process, such as ion implantation and/or a rapid thermal process to activate the doped regions. In some embodiments, the doped regions 224 may be formed by a plurality of ion implantation processes, such as LDD implant processes and S/D implant processes. In some embodiments, a silicide may be formed in the doped regions 224. The silicide may also be formed in the gate structures 214, 215.

An interlevel dielectric layer (ILD) 226 is also formed over the semiconductor device 200 by any suitable process, such as PVD, ALD, CVD, HDPCVD, spin-on coating, sputtering, other suitable methods, and/or combinations thereof. The ILD layer 226 may comprise any suitable material, such as silicon oxide, silicon oxynitride, low-k material, and/or other suitable materials. In one example, a CMP of the ILD 226 may be performed until the dummy gate layer 218 of gate structures 214, 215 is exposed as illustrated in FIG. 2A.

Referring to FIGS. 1 and 2B, at step 104, a portion of the gate structures 214, 215 is removed, thereby forming openings in the gate structures 214, 215. In the present embodiment, the dummy gate layer 218 and the interfacial dielectric layer 216 of gate structures 214, 215 is removed as illustrated in FIG. 2B. Removing the portions of the gate structures 214, 215 may be accomplished by any suitable process. For example, removing the interfacial dielectric layers 216 and the dummy gate layers 218 may include forming a photoresist layer over the semiconductor device 200; patterning the photoresist layer by a conventional photolithography process; and etching the photoresist layer to remove the interfacial dielectric layers 216 and the dummy gate layers 218. Subsequently, the photoresist layer may be removed. It is understood that the interfacial dielectric layers 216 and dummy gate layers 218 may be removed from gate structures 214, 215 simultaneously or independently. The removed interfacial dielectric layers 216 and the dummy gate layers 218 form an opening in the gate structures 214, 215.

At step 106, as illustrated in FIG. 2C, an interfacial layer 228, a high-k dielectric layer 230, a diffusion barrier/protection layer 232, and a first conductive layer 234 are formed over the substrate 210 and/or over the openings of the gate structures 214, 215. Particularly, the interfacial layer 228, high-k dielectric layer 230, diffusion barrier/protection layer 232, and first conductive layer 234 partially fill the openings of the gate structures 214, 215 in the first and second regions 211A, 211B.

In the present embodiment, the interfacial layer 228 is formed over the substrate 210 and/or over the openings of the gate structures 214, 215. The interfacial layer 228 may be formed by any suitable process and any suitable thickness. For example, the interfacial layer 228 may include a grown $SiO_2$ layer, and/or the interfacial layer 228 may comprise SiON. In the present embodiment, the interfacial layer 228 comprises a thickness between about 5 Å and 20 Å. In some embodiments, before the interfacial layer 228 is formed over the substrate 210, a last pre-gate clean (e.g., utilizing an HF solution) and UV process may be performed. In some embodiments, the interfacial layer 228 may be formed by rapid thermal oxidation. Further, in some embodiments, the interfacial layer 228 may be omitted entirely. It is understood that, in some embodiments, the interfacial dielectric layer 216 of the gate structures 214, 215 may not be removed from the gate structures 214, 215 as discussed above, which may eliminate the need to form the interfacial layer 228.

The high-k dielectric layer 230 is formed over semiconductor device 200, particularly the openings of the gate structures 214, 215. In the present embodiment, the high-k dielectric layer 230 is also formed over the interfacial layer 228. In some embodiments, where the interfacial dielectric layer 216 has not been removed, the high-k dielectric layer 230 may be formed over the interfacial dielectric layer 216. The high-k dielectric layer 230 may comprise any suitable thickness. In the present embodiment, the high-k dielectric layer 230 comprises a thickness between about 10 Å and 30 Å. The high-k dielectric layer 230 may include a high-k dielectric materials such as $HfO_2$, HfSiO, HfSiON, HfTaO, HfTiO, HfZrO, other suitable high-k dielectric materials, and/or combinations thereof. The high-k dielectric material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer 230 may be formed by any suitable process, such as ALD, CVD, PVD, RPCVD, PECVD, MOCVD, sputtering, plating, other suitable processes, and/or combinations thereof.

The diffusion barrier/protection layer 232 is formed over the high-k dielectric layer 230. The diffusion barrier/protection layer 232 may comprise titanium, titanium nitride, tantalum, tantalum nitride, tungsten, aluminum, TaCN, TiAlN, TaSiN, WN, other suitable materials, and/or combinations thereof. In the present embodiment, the diffusion barrier layer 232 comprises a thickness between about 10 Å and 200 Å. The diffusion barrier/protection layer may be formed by any suitable process, such as CVD, PVD, ALD, thermal oxide, plating, and/or combinations thereof. It is understood that the diffusion barrier/protection layer 232 may be omitted entirely in alternate embodiments.

The first conductive layer 234 is formed over the substrate 210, and in the present embodiment, over the diffusion barrier/protection layer 232. The first conductive layer 234 may be formed using CVD, PVD, ALD, thermal oxide, plating, other suitable processes, and/or combinations thereof. The first conductive layer 234 may comprise any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, other suitable materials, and/or combinations thereof. The first conductive layer 234 may further include a multilayer structure comprising multiple materials. Further, the first conductive layer 234 may be doped polycrystalline silicon with the same or different doping. In some embodiments, the first conductive layer 234 may comprise doped conducting metal oxides, such as the materials described in U.S. Provisional Patent Application No. 61/091,960 entitled "A Structure and Method for a CMOS Device with Doped Conducting Metal Oxide as the Gate Electrode" (filed Aug. 26, 2008), which is hereby incorporated by reference. In some embodiments, the first conductive layer 234 comprises one or more work function materials, for example, a p-type work function material or a n-type work function material. In the present embodiment, the first conductive layer 234 comprises a p-type work function material.

At step 108, a hard mask layer 236 is formed over the substrate 210, wherein the hard mask layer 236 fills the remainder of the openings of gate structures 214, 215 as illustrated in FIG. 2D. The hard mask layer 236 may comprise silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, TEOS oxide, plasma enhanced oxide (PE oxide), high aspect ratio deposition process (HARP) oxide, other proper porous polymeric materials, other suitable low-k dielectric materials, and/or combinations thereof. In the present embodiment, the hard mask layer 236 comprises SiOC and/or SOG. The hard mask layer 236 is formed by any suitable process, such as PVD, CVD, PECVD, RTCVD, ALD, MOCVD, other suitable processes, and/or combinations thereof. The hard mask layer 236 may include a single layer or multiple layers. Further, the hard mask layer 236 comprises any suitable thickness. In the present embodiment, the hard mask layer 236 comprises a thickness between about 100 Å and 3,000 Å. In some embodiments, the hard mask layer 236 comprises a thickness of about 2,000 Å.

Conventional processing follows by removing the hard mask layer in various regions utilizing a single etching process. For example, typically, the method would continue with conventional photolithography patterning and etching processes, wherein the hard mask layer 236 is completely removed in the first/NMOS region 211A and/or the second/PMOS region 211B by a dry etching process or a wet etching process. However, it has been observed that removing the hard mask layer in various regions with solely a dry etching process or a wet etching process causes undesirable results in open areas, i.e., areas where the hard mask layer is removed. More particularly, a dry etching process alone causes gate structure damage (e.g., to the conductive layers and the high-k dielectric layers), and a wet etching process alone causes lateral etching issues. Further, photoresist layers utilized during the conventional processing tend to exhibit peeling and/or leave photoresist residue. Such issues lead to poor device performance.

Accordingly, the present embodiments provide a method wherein one or more etching processes are combined to remove the hard mask layer from various regions of the device when patterning the gate structures. More particularly, a first etching process partially removes the hard mask layer in the open areas, a second etching process treats the remaining hard mask layer in the open areas, and a third etching process removes the remaining hard mask layer in the open areas. For example, as further discussed below, a first etching process, a dry etching process, partially removes the hard mask layer 236 in the first/NMOS region 211A; the hard mask layer is treated with a second etching process, a dry etching process; and then, a third etching process, a wet etching process, completely removes the remaining portion of the hard mask layer 236 in the first/NMOS region 211A. Utilizing a combination of etching processes on the hard mask layer in the open areas eliminates the issues discussed above, providing improved device performance.

Referring to FIG. 1 and FIGS. 2E-2G, at step 110, a portion of the hard mask layer 236 in the first region 211A is removed (i.e., the hard mask layer 236 is partially removed in the first/NMOS region 211A). The hard mask layer 236 may be removed by any suitable process, such as conventional deposition, photolithography patterning, and etching processes, and/or combinations thereof. The deposition processes may include CVD, PVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

As illustrated in FIGS. 2E and 2F, a photoresist layer 238 is formed over the hard mask layer 236 and patterned to form first portions 238A over the first region 211A and second portions 238B over the second region 211B. The photoresist layer 238 may be formed and patterned (e.g., utilizing HMDS) by any suitable process and to any suitable thickness. In the present embodiment, the photoresist layer 238 comprises a thickness between about 1,000 Å and 3,000 Å. The first and second portions 238A, 238B may be formed by any suitable process to protect the first and/or second regions 211A, 211B from subsequent processing. In the present embodiment, the second portion 238B provides a covered area of the hard mask layer 236 in the second region 211B (essentially protecting the second/PMOS region 211B and/or hard mask layer 236 in the second region 211B from subsequent processing), and the first portion 238A provides an open area of the hard mask layer 236 in the first region 211A. It is understood that additional layers may be formed above or below the photoresist layer 238, such as antireflective coating layers (e.g., TARC and/or BARC).

Referring to FIG. 2G, after the photoresist layer 238 is formed and patterned, an etching process comprising a first dry etching process 240 removes the first portion 238A of the photoresist layer 238 and partially removes hard mask layer 236 in the first/NMOS region 211A. The first dry etching process 240 leaves a remaining portion of the hard mask layer 236 in the first region 211A. The remaining portion of the hard mask layer 236 in the first region 211A may comprise any suitable thickness. In the present embodiment, the remaining portion of the hard mask layer 236 in the first region 211A comprises a thickness between about 100 Å and 500 Å. The first dry etching process 240, which only partially removes the hard mask layer 236 in the first region 211A, improves the etching profile of the hard mask layer 236 and prevents damage to the high-k dielectric layer 230 and conductive layer 234. It is understood that the first etching process 240 may include multiple etching steps and etching solutions to partially remove the hard mask layer 236.

At step 112, the remaining portion of the hard mask layer 236 in the first region 211A is treated by a second etching process 242. The second etching process 242 comprises a dry etching process, which may implement an oxygen-containing gas, nitrogen-containing gas, flourine-containing gas, chlorine-containing gas, bromine-containing gas, iodine-containing gas, other suitable gases and/or plasmas, and/or combinations thereof. In some embodiments, the dry etching process may utilize SPM (sulfuric and hydrogen peroxide mixture), DIW-$O_3$, $H_2O_2$, and/or combinations thereof. For example, in the present embodiment, the second etching process 242 utilizes an $O_2$ plasma treatment and/or an $O_2/N_2$ plasma treatment. In some embodiments, the second etching process 242 treating the hard mask layer 236 in the first region 211A simultaneously removes the second portion 238B of the photoresist layer as illustrated in FIG. 2H. It is understood that the second etching process 242 may include multiple etching steps and etching solutions to treat the hard mask layer 236.

The second etching process 242 improves and modifies the etching selectivity of the hard mask layer 236 in unprotected/open areas (i.e., the first region 211A) as compared to the hard mask layer 236 in protected/covered areas (i.e., the second region 211B, or areas protected by the second portion 238B of the photoresist layer 238). The etching rate of the hard mask layer 236 in the first region 211A may be fine tuned utilizing the second dry etching process 242, allowing the etching rate difference between the unprotected hard mask layer 236 and the protected hard mask layer 236 to be tuned to 100× multiple differences. For example, it has been observed that when treating the unprotected hard mask layer 236 in the first region 211A with an $O_2$ plasma treatment, the etching rate of the unprotected hard mask layer 236 increases (which may be attributed to the $O_2$ plasma treatment promoting Si—$CH_3$ depletion in the unprotected hard mask layer 236, promoting Si—OH and H—OH bonding absorption, and/or causing the unprotected hard mask layer 236 to become hydrophilic). Thus, it is possible to control the carbon depletion of the unprotected hard mask layer 236 by tuning the etching recipe of the second etching process 242, thereby selectively tuning the etching rate of the unprotected hard mask layer 236. The wet and/or dry etching rate of the unprotected hard mask layer 236 may be tuned and controlled by varying the conditions of the second etching process/treatment 242.

Referring to FIG. 1 and FIG. 2I, at step 114, the remaining portion of the hard mask layer 236 in the first region 211A is removed by a third etching process. The third etching process 244 comprises a wet etching process. The third etching process 244 may be applied for any suitable time. In the present embodiment, the third etching process 244 utilizes a hydrofluoric acid (HF) solution for a HF dipping process. The HF solution may have any suitable concentration (e.g., 1:100). In some embodiments, the third etching process 244 may apply a diluted hydrofluoric acid (HF) to the semiconductor device 200. The third etching process 244 (in the present embodiment, the wet etching process) applied after the first and second dry etching processes 240, 242 selectively removes the remaining portion of the hard mask layer 236 in the first region 211A. As noted above, the second etching process 242, which provided tuning of the etching rate of the remaining portion of the hard mask layer 236 in the first region 211A, lends an improved wet etching profile and prevents lateral etching issues during the third etching process 244.

In some embodiments, as illustrated in FIGS. 2J-2K, the first conductive layer 234 may be removed from the first region 211A, and a second conductive layer 248 may be formed in the first region 211A. The first conductive layer 234 may be removed from the first region 211A by any suitable process, such as an etching process 246. For example, the first conductive layer 234 is removed by a wet etching process, particularly, a wet etching process utilizing an APM (ammonia/hydrogen peroxide mix) solution. In some embodiments, the wet etching solution may comprise hydrogen peroxide ($H_2O_2$), ozone ($O_3$), sulfuric acid ($H_2SO_4$), phosphoric acid ($H_3PO_4$), acetic acid ($CH_3COOH$), SPM, hydrochloric and hydrogen peroxide mixture (HPM), other suitable solutions, and/or combinations thereof. In some embodiments, the first conductive layer 234 may be removed by utilizing a $NH_4OH$ and $H_2O_2$ solution (SC1).

The second conductive layer 248 is formed over the substrate 210, and in the present embodiment, over the diffusion barrier/protection layer 232 in the first region 211A. The second conductive layer 248 may be formed using CVD, PVD, ALD, thermal oxide, plating, other suitable processes, and/or combinations thereof. The second conductive layer 248 may comprise any suitable material, such as aluminum, copper, tungsten, titanium, tantalum, titanium nitride, tantalum nitride, nickel silicide, cobalt silicide, silver, TaC, TaSiN, TaCN, TiAl, TiAlN, WN, metal alloys, other suitable materials, and/or combinations thereof. The second conductive layer 248 may further include a multilayer structure comprising multiple materials. Further, the second conductive layer 248 may be doped polycrystalline silicon with the same or different doping. In some embodiments, the second conductive layer 248 may comprise doped conducting metal oxides as described above regarding the first conductive layer 234. In some embodiments, the second conductive layer 248 comprises one or more work function materials, for example, a p-type work function material or a n-type work function material. In the present embodiment, the second conductive layer 248 comprises an n-type work function material. Accordingly, the semiconductor device 200 will essentially comprise at least one gate structure 214 having an n-work function in the first/NMOS region 211A and at least one gate structure 215 having a p-work function in the second/PMOS region 211B.

Referring to FIG. 2L, at step 116, the hard mask layer 236 is removed from the second region 211B by a fourth etching process 250, thereby completely removing the hard mask layer 236 from the semiconductor device 200. The fourth etching process 250 comprises a wet etching process. In the present embodiment, the fourth etching process 250 utilizes a hydrofluoric acid (HF) solution for a HF dipping process. The HF solution may have any suitable concentration, such as a HF solution having a concentration ranging from about 1:5 to about 1:1000. In the present embodiment, the HF solution comprises a concentration of about 1:100. In some embodiments, the fourth etching process 250 may apply a diluted hydrofluoric acid (HF) to the semiconductor device 200. The etching duration may be any suitable time, such as an etching duration ranging from about 10 seconds to about five minutes. In the present embodiment, the etching duration is about three minutes. The fourth etching process 250 selectively removes the remaining portion of the hard mask layer 236 in the second region 211B, resulting in the semiconductor device 200 illustrated at FIG. 2M.

It is understood that the semiconductor device 200 may undergo further CMOS or MOS technology processing to form various features known in the art. For example, bulk metal regions may be formed over the conductive layers 234, 248 by any suitable processes, such as deposition, photolithography, and etching processes, and/or combinations thereof. The bulk metal regions may comprise aluminum deposited by CVD, followed by a CMP. In some embodiments, the bulk metal regions may comprise any suitable material, such as copper, tungsten, titanium, tantulum, titanium nitride, tantalum nitride, nickel silicide, cobalt silicide; other proper conductive materials; and combinations thereof. In some embodiments, the bulk metal regions may comprise different materials. Further, subsequent processing may form various contacts/vias and multilayer interconnect features (e.g., metal layers and interlayer dielectrics) on the substrate 210, configured to connect the various features or structures of the semiconductor device 200.

The disclosed embodiments provide one or more of the following advantages: (1) improves overall device performance, particularly high-k/metal gate device performance; (2) improves gap-filling ability; (3) improves photoresist adhesion; (4) prevents damage to gate layers (e.g., high-k dielectric layers and/or conductive layers); (5) provides tunability of the etching rate of a hard mask layer; (6) prevents lateral etching issues; and (7) improves gate profiles. In summary, a method for fabricating an integrated circuit with improved device performance is disclosed. The method comprises providing a substrate; forming a hard mask layer over the substrate; forming protected portions and unprotected portions of the hard mask layer; performing a first etching process, a second etching process, and a third etching process on the unprotected portions of the hard mask layer, wherein the first etching process partially removes the unprotected portions of the hard mask layer, the second etching process treats the unprotected portions of the hard mask layer, and the third etching process removes the remaining unprotected portions of the hard mask layer; and performing a fourth etching process to remove the protected portions of the hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, wherein the integrated circuit includes a substrate, the method comprising:
   forming a hard mask layer over the substrate;
   forming protected portions and unprotected portions of the hard mask layer;
   performing a first etching process, a second etching process, and a third etching process on the unprotected portions of the hard mask layer, wherein the first etching process partially removes the unprotected portions of the hard mask layer, the second etching process treats the unprotected portions of the hard mask layer, and the third etching process removes the remaining unprotected portions of the hard mask layer; and performing a fourth etching process to remove the protected portions of the hard mask layer.

2. The method of claim 1 wherein forming protected portions and unprotected portions of the hard mask layer comprises:

forming a photoresist layer over the hard mask layer; and patterning the photoresist layer over the hard mask layer to comprise a first portion and a second portion, wherein the second portion protects portions of the hard mask layer from subsequent processing.

3. The method of claim 1 wherein the hard mask layer comprises spin-on glass (SOG).

4. The method of claim 1 wherein at least one of either performing the first etching process or performing the second etching process comprises performing a dry etching process.

5. The method of claim 1 wherein at least one of either performing the third etching process or performing the fourth etching process comprises performing a wet etching process.

6. The method of claim 5 wherein performing a wet etching process comprises utilizing a hydrofluoric acid (HF) solution.

7. The method of claim 1 wherein performing the second etching process comprises utilizing an $O_2$ plasma treatment.

8. The method of claim 1 wherein performing the second etching process comprises utilizing a sulfuric peroxide mixture (SPM) solution.

9. The method of claim 1 wherein performing the second etching process comprises utilizing ozone ($O_3$) and de-ionized water (DIW).

10. The method of claim 1 wherein performing the first etching process partially removing the unprotected portions of the hard mask layer comprises providing the remaining unprotected portions of the hard mask layer with a thickness between about 100 Å and 500 Å.

11. A method for fabricating an integrated circuit, wherein the integrated circuit includes a substrate, the method comprising:

forming a first set of gate structures and a second set of gate structures over the substrate, wherein the first and second set of gate structures include an interfacial layer, a high-k dielectric layer, a first conductive layer, and a hard mask layer;

partially removing the hard mask layer from the first set of gate structures utilizing a first dry etching process;

treating a remaining portion of the hard mask layer in the first set of gate structures utilizing a second dry etching process;

removing the remaining portion of the hard mask layer in the first set of gate structures utilizing a first wet etching process; and removing the hard mask layer from the second set of gate structures utilizing a second wet etching process.

12. The method of claim 11 wherein treating the remaining portion of the hard mask layer in the first set of gate structures comprises utilizing $O_2$, SPM, DIW-$O_3$, $H_2O_2$, and/or combinations thereof.

13. The method of claim 11 wherein at least one of either utilizing the first wet etching process or the second etching process comprises utilizing a hydrofluoric acid (HF) solution.

14. The method of claim 11 further comprising, prior to removing the hard mask layer from the second set of gate structures:

removing the first conductive layer from the first set of gate structures; and forming a second conductive layer for the first set of gate structures.

15. The method of claim 14 wherein removing the first conductive layer of the first set of gate structures comprises utilizing a $NH_4OH$ and $H_2O_2$ solution (SC1) and/or an ammonia/hydrogen peroxide mix (APM) solution.

16. A method for fabricating an integrated circuit, the method comprising:

providing a substrate having a first region that includes at least one gate structure and a second region that includes at least one gate structure;

forming an opening in the at least one gate structure of the first region and the at least one gate structure of the second region;

forming an interfacial layer, a high-k dielectric layer, and a first conductive layer over the substrate, wherein the interfacial layer, high-k dielectric layer, and first conductive layer partially fill in the openings of the at least one gate structures of the first and second regions;

forming a hard mask layer over the substrate, wherein the hard mask layer fills the remainder of the openings in the at least one gate structures of the first and second regions;

removing a portion of the hard mask layer in the first region;

treating a remaining portion of the hard mask layer in the first region;

removing the remaining portion of the hard mask layer in the first region;

removing the first conductive layer partially filling in the opening of the at least one gate structure of the first region;

forming a second conductive layer in the opening of the at least one gate structure in the first region; and removing the hard mask layer in the second region.

17. The method of claim 16 wherein removing the portion of the hard mask layer in the first region and treating the remaining portion of the hard mask layer in the first region comprises performing a dry etching process.

18. The method of claim 16 wherein removing the remaining portion of the hard mask layer in the first region and removing the hard mask layer in the second region comprises performing a wet etching process.

19. The method of claim 16 wherein removing the first conductive layer partially filling in the opening of the at least one gate structure of the first region comprises performing a wet etching process.

20. The method of claim 19 wherein performing the wet etching process comprises utilizing an ammonia/hydrogen peroxide mix (APM) solution.

* * * * *